United States Patent
Nishimura et al.

(10) Patent No.: US 12,376,232 B2
(45) Date of Patent: Jul. 29, 2025

(54) WIRING SUBSTRATE

(71) Applicant: SHINKO ELECTRIC INDUSTRIES CO., LTD., Nagano (JP)

(72) Inventors: Koichi Nishimura, Nagano (JP); Kazuhiro Kobayashi, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 250 days.

(21) Appl. No.: 18/193,708

(22) Filed: Mar. 31, 2023

(65) Prior Publication Data

US 2023/0319992 A1    Oct. 5, 2023

(30) Foreign Application Priority Data

Apr. 4, 2022   (JP) .................. 2022-062612

(51) Int. Cl.
 *H05K 1/02* (2006.01)
 *H05K 1/11* (2006.01)

(52) U.S. Cl.
 CPC ........... *H05K 1/116* (2013.01); *H05K 1/0298* (2013.01); *H05K 2201/09563* (2013.01); *H05K 2201/10734* (2013.01)

(58) Field of Classification Search
 CPC ................. H05K 1/116; H05K 1/0298; H05K 2201/09563; H05K 2201/10734; H05K 2201/0338; H05K 2201/09472; H05K 3/4007; H05K 1/113; H05K 3/3436; H05K 2201/098; H05K 2201/190745; H05K 2201/109472; H05K 2201/0367; H05K 2201/0347

See application file for complete search history.

(56) References Cited

U.S. PATENT DOCUMENTS

| | | | |
|---|---|---|---|
| 2011/0284277 A1* | 11/2011 | Kato | H05K 1/113 174/258 |
| 2013/0100626 A1 | 4/2013 | Inoue et al. | |
| 2013/0284499 A1* | 10/2013 | Imafuji | H05K 3/244 174/250 |
| 2022/0330426 A1* | 10/2022 | Matsui | H05K 1/09 |

FOREIGN PATENT DOCUMENTS

| | | |
|---|---|---|
| JP | 2013-093404 A | 5/2013 |
| JP | 2020-136652 A | 8/2020 |
| JP | 2022-161152 A | 10/2022 |

* cited by examiner

*Primary Examiner* — Jayprakash N Gandhi
*Assistant Examiner* — Aditya Sharma
(74) *Attorney, Agent, or Firm* — Rankin, Hill & Clark LLP

(57) ABSTRACT

A wiring substrate includes a wiring layer that includes a first pad on which a first recess portion is formed and a second pad on which a second recess portion is formed; an insulating layer that includes a first opening portion penetrating to the first recess portion and a second opening portion penetrating to the second recess portion; a first metal layer filling each of the first opening portion and the second opening portion, extending on an upper surface of the insulating layer, and including a third recess portion and a fourth recess portion; and a second metal layer a part of which is stored in the third recess portion and the fourth recess portion, wherein the first metal layer has a uniform thickness at a portion extending on the upper surface, and the fourth recess portion is deeper than the third recess portion.

11 Claims, 12 Drawing Sheets

WIRING SUBSTRATE

CROSS-REFERENCE TO RELATED APPLICATION

This application is based upon and claims the benefit of priority of the prior Japanese Patent Application No. 2022-062612, filed on Apr. 4, 2022, the entire contents of which are incorporated herein by reference.

FIELD

The embodiment discussed herein is related to a wiring substrate and a method of manufacturing the wiring substrate.

BACKGROUND

In general, on a wiring substrate on which a semiconductor chip is mounted, a bump is formed as a connection terminal connected to the semiconductor chip. The bump is a metal projection that is connected to a conductor layer formed on the wiring substrate and that outwardly protrudes from an opening portion that is provided in a solder resist layer that covers the conductor layer. This type of bump sometimes has a two-layered structure that is formed by performing plating using, for example, two different types of metals.

Specifically, at the opening portion provided in the solder resist layer and the circumference of the opening portion, plating is performed on a first metal layer that is made of, for example, copper or the like, and plating is performed on a second metal layer that is located at an upper layer of the first metal layer and that is made of, for example, tin, solder, or the like. Then, by melting and solidifying only the second metal layer using a reflow process, the bump having a surface in a spherical shape is formed. In other words, a melting point of the second metal layer is lower than that of the first metal layer, so that it is possible to form the bump by melting only the second metal layer without melting the first metal layer as a result of setting an appropriate reflow temperature.

Patent Document 1: Japanese Laid-open Patent Publication No. 2020-136652

Patent Document 2: Japanese Laid-open Patent Publication No. 2013-093404

Incidentally, in some cases, the wiring substrate and the semiconductor chip are connected via a plurality of bumps. In other words, for example, in some cases, a connection terminal that is used to input and output an electric signal and a connection terminal that is used to apply a power supply voltage are separately provided. In such a case, the diameter of the bumps functioning as the connection terminals are not always the same, and bumps each having a different diameter are sometimes provided. Specifically, bumps each having a small diameter and bumps each having a large diameter are present in a mixed manner, such as a case in which, for example, the diameter of the bumps each of which is used to input and output an electric signal is relatively small, whereas the diameter of the bumps each of which is used to apply a power supply voltage is relatively large.

If these bumps are formed by being subjected to plating having the two-layered structure as described above, the bump having a larger diameter is higher than the bump having a smaller diameter. In other words, at the step of performing plating on the first metal layer and the second metal layer, the bump having a smaller diameter and the bump having a larger diameter are plated with the same thickness, so that a cubic volume of the second metal layer at the bumps each having the larger diameter is greater than the cubic volume of the second metal layer at the bumps each having the smaller diameter. In addition, if the second metal layer is melted and solidified, the surface of the second metal layer exhibits a spherical shape. In this state, the bumps each having the larger diameter protrude higher than the bumps each having the smaller diameter.

In this way, if the bumps each having a different height are present in a mixed manner, the connection reliability between the wiring substrate and the semiconductor chip is decreased. In other words, at the bump having a smaller diameter and a low height, a poor open sometimes occurs caused by an insufficient connection between a bump apex portion and an electrode of the semiconductor chip. Accordingly, regarding the bump having the smaller diameter, by increasing the cubic volume of the second metal layer as a result of performing additional plating and by increasing the height of the bump, the height of the bump having the larger diameter and the height of the bump having the small diameter are sometimes aligned.

However, in the case where additional plating is performed on only the bump having the smaller diameter formed on the second metal layer, the number of steps is increased in the manufacturing process of the wiring substrate, so that there is a problem in that the cost is increased and the yield rate is decreased. In other words, in the case where plating is performed on only the bumps each having the smaller diameter, after patterning or the like of resist is performed in order to mask the bumps each having the larger diameter, plating is performed by using tin, solder, or the like. In other words, a step of patterning or the like is added in accordance with the additional plating, and the efficiency at the time of manufacturing of the wiring substrate is decreased.

A decrease in the manufacturing efficiency as described above does not only occur in the wiring substrate on which the semiconductor chip is mounted, but may also possibly occur in the wiring substrate on which another electronic component is mounted via the plurality of bumps.

SUMMARY

According to an aspect of an embodiment, a wiring substrate includes a wiring layer that includes a first pad on a surface of which a first recess portion is formed and a second pad on a surface of which a second recess portion that is deeper than the first recess portion of the first pad is formed; an insulating layer that covers the wiring layer and that includes a first opening portion that penetrates to the first recess portion of the first pad and a second opening portion that penetrates to the second recess portion of the second pad and that has a larger diameter than the first opening portion; a first metal layer that fills an interior of each of the first opening portion and the second opening portion, that extends on an upper surface of the insulating layer, and that includes a third recess portion at a position overlapping with the first opening portion and a fourth recess portion at a position overlapping with the second opening portion in a plan view; and a second metal layer that is formed to be superposed on the first metal layer and a part of which is stored in the third recess portion and the fourth recess portion of an upper surface of the first metal layer, wherein the first metal layer has a uniform thickness at a portion extending on the upper surface of the insulating layer, and the fourth recess portion is deeper than the third recess portion.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

Preferred embodiment of a wiring substrate and a method of manufacturing the wiring substrate disclosed in the present invention will be explained in detail below with reference to the accompanying drawings. Furthermore, the present invention is not limited to the embodiment.

Figure 1:
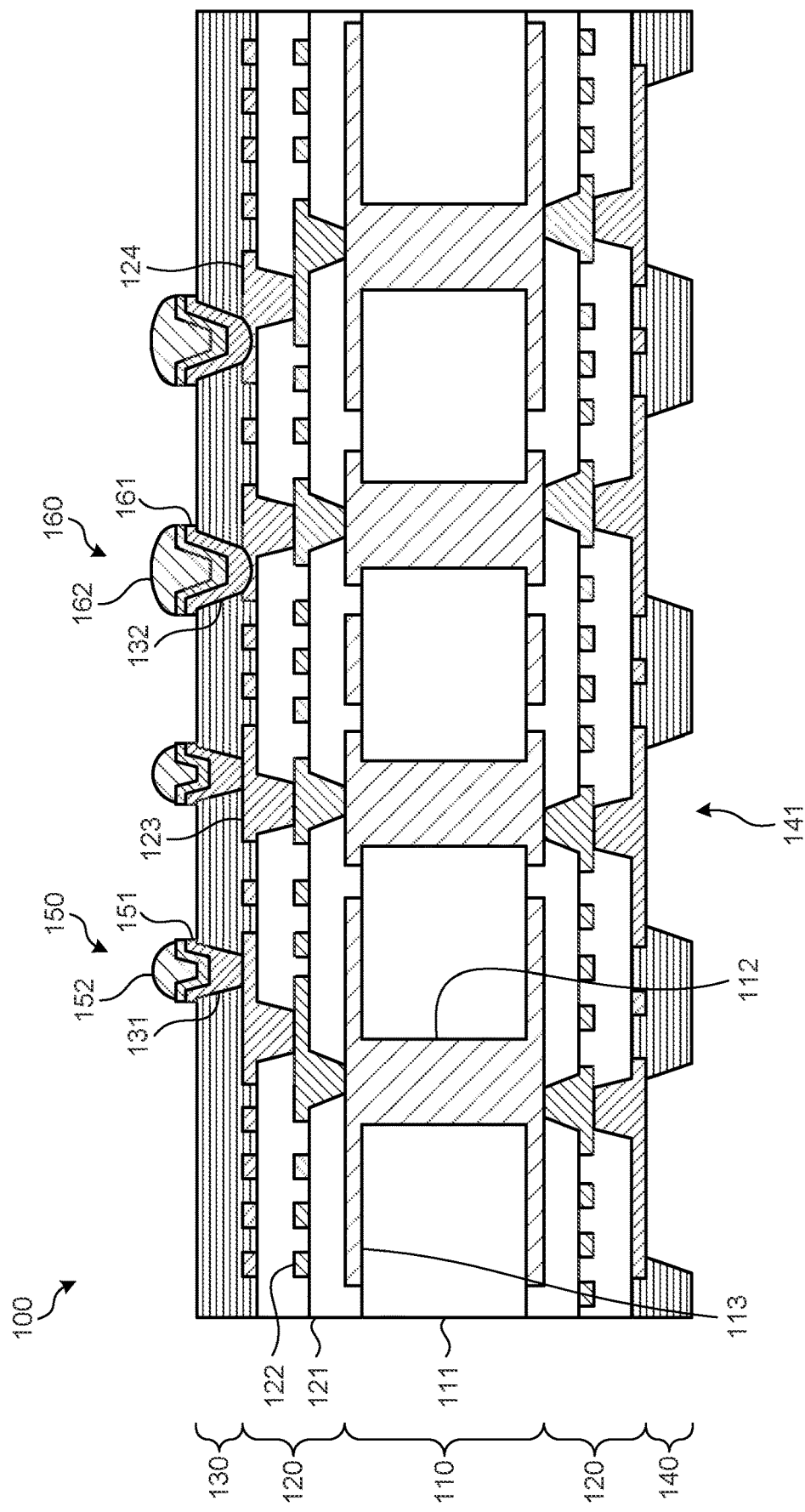
FIG. 1 is a diagram illustrating a configuration of a wiring substrate according to one embodiment.

FIG. 1 is a diagram illustrating a configuration of a wiring substrate 100 according to one embodiment. FIG. 1 illustrates a schematic cross-sectional view of the wiring substrate 100. The wiring substrate 100 illustrated in FIG. 1 is able to use a substrate of a semiconductor package on which, for example, a semiconductor chip is mounted.

The wiring substrate 100 has a laminated structure and includes a core substrate 110, multi-layer wiring structures 120, and solder resist layers 130 and 140. In the following, as illustrated in FIG. 1, a description will be made on the assumption that the solder resist layer 140 is a lowermost layer and the solder resist layer 130 is an uppermost layer; however, the wiring substrate 100 may be used by, for example, vertically inverting the surfaces, or may be used in an arbitrary orientation.

The core substrate 110 has a structure in which wiring layers 113 are formed by performing plating on both of the surfaces of associated base materials 111 each of which has a plate shaped insulation material. The wiring layers 113 provided on both of the surfaces of the associated base materials 111 are connected, as needed, by vias 112.

Each of the multi-layer wiring structures 120 is constituted by laminating an insulating layer 121 having an insulation property and a wiring layer 122 having conductivity. In FIG. 1, two layers are laminated in inside the multi-layer wiring structure 120 that is formed on an upper portion of the core substrate 110, whereas two layers are laminated inside the multi-layer wiring structure 120 that is formed on a lower portion of the core substrate 110; however, the number of layers to be laminated may be one, or three or more.

On the wiring layer 122 that is the uppermost layer, pads 123 and 124 that are connected to bumps 150 and 160, respectively, functioning as connection terminals for connecting to the semiconductor chips are formed. Specifically, the pad 123 is formed on the wiring layer 122 that is connected to the bump 150 having a small diameter, and, in contrast, the pad 124 is formed on the wiring layer 122 that is connected to the bump 160 having a large diameter. A recess portion is formed on the surface of each of the pads 123 and 124, and the bumps 150 and 160 are connected to the wiring layer 122 at the associated recess portions.

The solder resist layer 130 is a layer that covers the wiring layer 122 located at the uppermost layer of the multi-layer wiring structure 120 and that protects the wiring. The solder resist layer 130 is a layer constituted of, for example, a photosensitive resin, such as an acrylic resin and polyimide resin, having an insulation property, and is one of the insulating layers. Furthermore, the solder resist layer 130 may be formed by using, for example, a non-photosensitive resin, such as an epoxy resin, having an insulation property.

The solder resist layer 130 side of the wiring substrate 100 is a surface on which, for example, an electronic component, such as a semiconductor chip, is mounted. At the position at which the semiconductor chip is mounted, opening portions 131 and 132 are drilled into the solder resist layer 130. In other words, the opening portions 131 and 132 are provided at the position at which the bumps 150 and 160 formed on the solder resist layer 130 are formed. The diameters of the opening portions 131 and 132 are different from each other, the opening portion 132 has a larger diameter than the opening portion 131. In the case where the solder resist layer 130 is formed by using a photosensitive resin, it is possible to form the opening portions 131 and 132 by performing a process of exposure and development. Furthermore, in the case where the solder resist layer 130 is formed by using a non-photosensitive resin, it is possible to form the opening portions 131 and 132 by performing a process of laser beam machining.

The pads 123 and 124 are exposed on the bottom surfaces of the opening portions 131 and 132, respectively, and the bumps 150 and 160 are connected to the pads 123 and 124, respectively. In other words, the bump 150 that has a smaller diameter is formed at the opening portion 131 that has a smaller diameter and is connected to the pad 123, whereas the bump 160 that has a larger diameter is formed at the opening portion 132 that has a larger diameter and is connected to the pad 124.

Each of the bumps 150 and 160 has a two-layered structure constituted of two different types of metals. Specifically, the bump 150 includes a first metal layer 151 that is made of, for example, copper or the like and a second metal layer 152 that is made of, for example, tin or the like, and furthermore, a layer that is made of, for example, nickel lies on a bonding surface between the first metal layer 151 and the second metal layer 152. In contrast, the bump 160 also includes a first metal layer 161 that is made of, for example, copper or the like and a second metal layer 162 that is made of, for example, tin or the like, and furthermore, a layer that is made of, for example, nickel lies on the bonding surface between the first metal layer 161 and the second metal layer 162. At each of the bumps 150 and 160, a recess portion is formed at the center of the upper surface of each of the first metal layers 151 and 161, and the center of the upper surface of each of the first metal layers 151 and 161 is located below the circumference. However, the recess portion of the first metal layer 151 is shallower than the recess portion of the first metal layer 161 and has a smaller cubic capacity. In addition, the second metal layers 152 and 162 protrude upward in a spherical shape such that a part of each of the second metal layers 152 and 162 is stored in the associated recess portions.

The bump 160 has a larger diameter than the diameter of the bump 150, so that the cubic volume of the second metal layer 162 is larger than that of the second metal layer 152; however, the recess portion formed on the first metal layer 161 has a larger cubic capacity than that of the recess portion formed on the first metal layer 151, so that a larger part of the second metal layer 162 is stored in the recess portion. As a result, the height from the surface of the solder resist layer 130 at the apex portion of the second metal layer 162 becomes low. As a result, even if the second metal layer 162 that has a larger cubic volume than that of the second metal layer 152 greatly protrudes upward, the height of the apex portion of the bump 150 is accordingly equal to the height of the apex portion of the bump 160. In addition, in the case where, for example, the semiconductor chip is mounted on an upper portion of the bumps 150 and 160, the apex portions of the bumps 150 and 160 are reliably brought into contact with the electrodes of the semiconductor chip, and it is thus possible to improve the connection reliability.

The solder resist layer 140 is a layer that covers the wiring layer 122 that is the lowermost layer of the multi-layer wiring structure 120 and that protects the wiring. The solder resist layer 140 is a layer constituted of, for example, a photosensitive resin, such as an acrylic resin and a polyimide resin, having an insulation property, and is one of the insulating layers. Furthermore, the solder resist layer 140 may be formed by using, for example, a non-photosensitive resin, such as an epoxy resin, having an insulation property.

The solder resist layer 140 side of the wiring substrate 100 is a surface that is connected to an external part, an external device, or the like. At the position at which the external connection terminal that is electrically connected to the external part or device is formed, an opening portion 141 is drilled into the solder resist layer 140, the wiring layer 122 having the multi-layer wiring structure 120 is exposed from the opening portion 141. At the opening portion 141, for example, an external connection terminal, such as a solder ball, is formed. In the case where the solder resist layer 140 is formed by using a photosensitive resin, it is possible to form the opening portion 141 by performing a process of exposure and development. Furthermore, in the case where the solder resist layer 140 is formed by using a non-photosensitive resin, it is possible to form the opening portion 141 by performing a process of laser beam machining.

Figure 2:
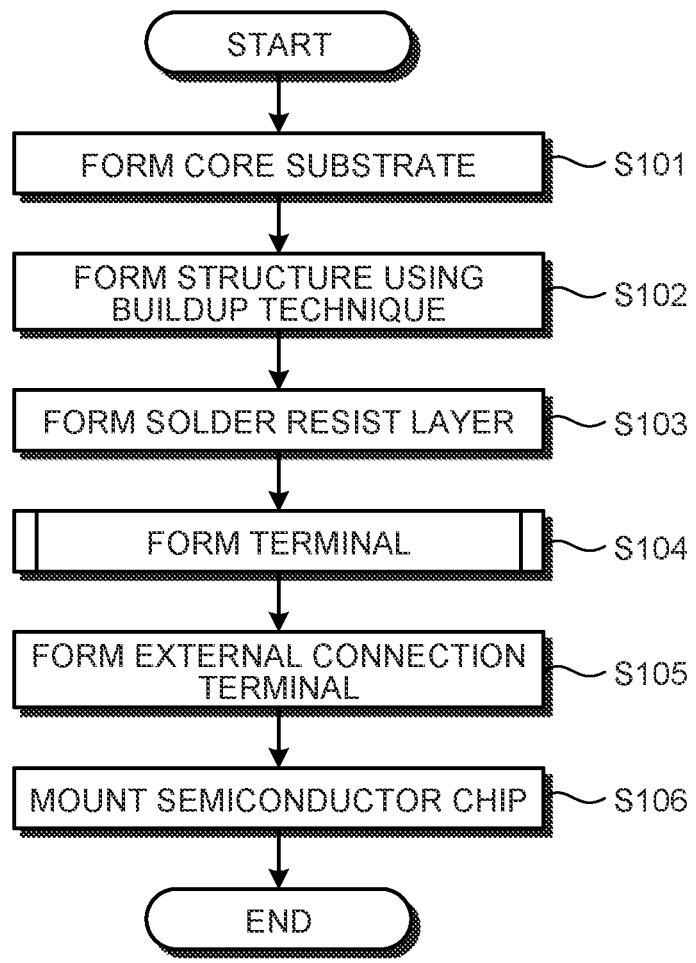
FIG. 2 is a flowchart illustrating a method of manufacturing a semiconductor package according to one embodiment.

In the following, a method of manufacturing a semiconductor package having the wiring substrate 100 configured as described above will be described, by using specific example, with reference to the flowchart illustrated in FIG. 2.

Figure 3:
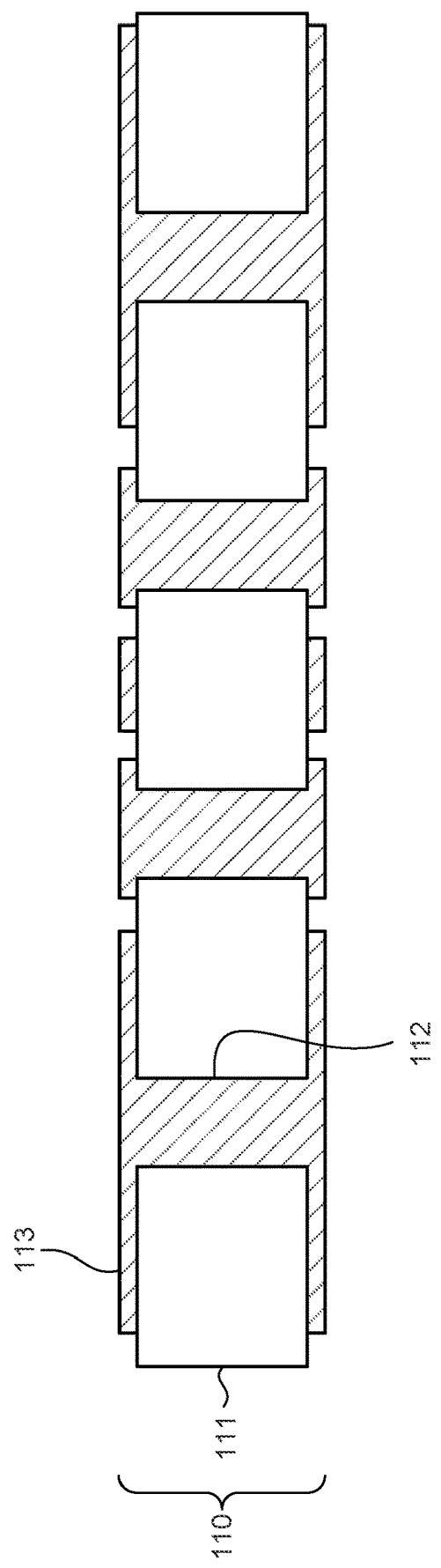
FIG. 3 is a diagram illustrating a specific example of forming a core substrate.

First, the core substrate 110 that serves as a support member of the wiring substrate 100 is formed (Step S101). Specifically, for example, as illustrated in FIG. 3, the vias 112 that passes through the associated base materials 111 are formed on the associated base materials 111 each of which is an insulation material having a plate shape, and the wiring layers 113 made of, for example, metal, such as copper, are formed on both surfaces of the associated base materials 111 by performing a process of, for example, copper foil or copper plating. The wiring layers 113 disposed on both surfaces of the associated base materials 111 are connected, as needed, by the associated vias 112 that are formed by performing plating on a metal made of, for example, copper or the like. Each of the base materials 111 used may be, for example, a material obtained by impregnating a reinforcement material, such as a glass woven fabric, with an insulating resin, such as an epoxy resin. The reinforcement material used may be, in addition to the glass woven fabric, a glass non-woven fabric, an aramid woven fabric, an aramid non-woven fabric, or the like. Furthermore, in addition to the epoxy resin, the insulating resin used may be a polyimide resin, a cyanate resin, or the like.

Figure 4:
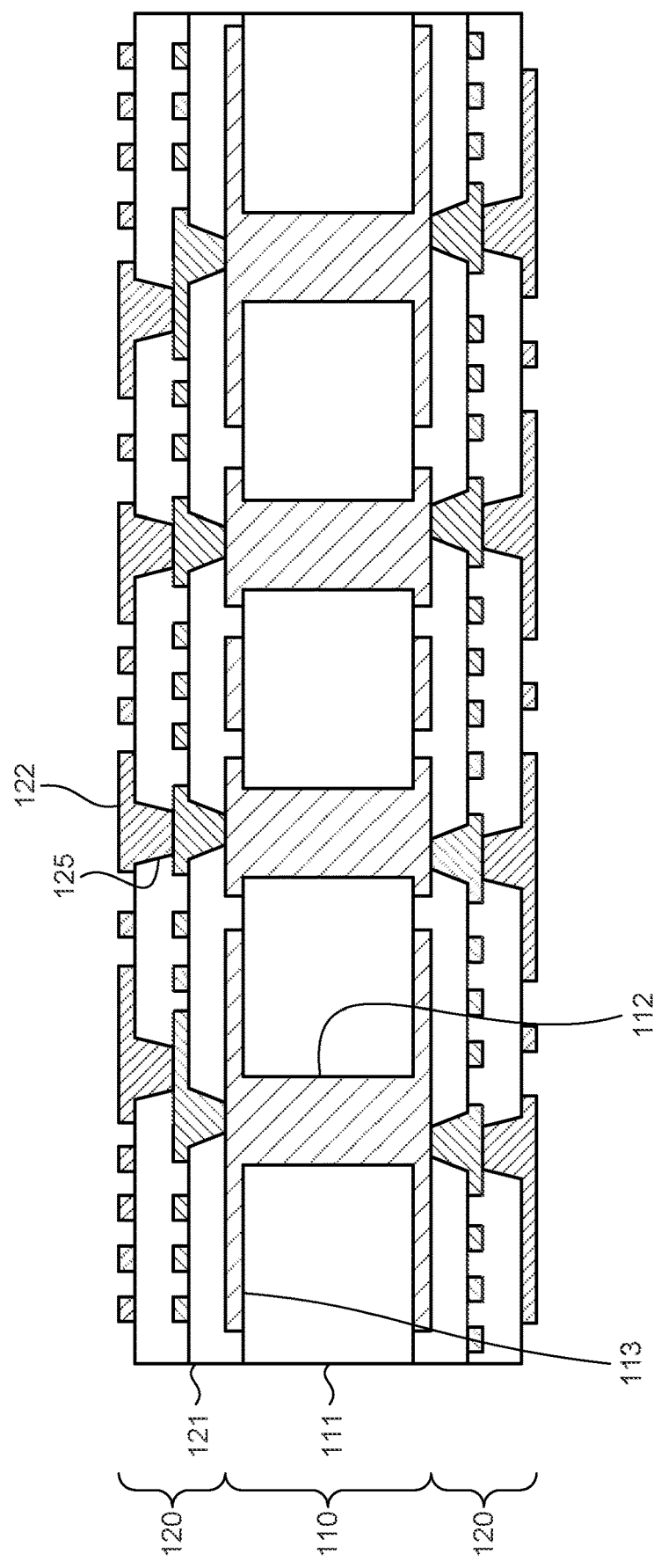
FIG. 4 is a diagram illustrating a specific example of buildup.

Then, the multi-layer wiring structures 120 are formed on the upper surface and the lower surface of the core substrate 110 by using a buildup technique (Step S102). Specifically, for example, as illustrated in FIG. 4, the insulating layers 121 are formed on the upper surface and the lower surface of the core substrate 110, and the wiring layers 122 are formed on the surface of the associated insulating layers 121. Each of the insulating layers 121 is formed by using, for example, an insulating resin, such as an epoxy resin or a polyimide resin. Furthermore, each of the wiring layers 122 is formed by performing plating on a metal made of, for example, copper or the like.

Between the wiring layer 113 and the wiring layer 122 that are formed on the core substrate 110, or between the wiring layers 122 that are formed on the adjacent layers is, as needed, connected by a via 125 that is formed by performing plating on a metal made of, for example, copper or the like. The insulating layer 121 and the wiring layer 122 may be layered in multiple times on the upper surface and the lower surface of the core substrate 110. In the wiring layer 122 that is the uppermost layer, the pad 123 is formed at the position in which the bump 150 having a smaller diameter is formed, whereas the pad 124 is formed at the position in which the bump 160 having a larger diameter is formed.

When the multi-layer wiring structures 120 are formed, the wiring layers 122 that are the outermost layer of the associated multi-layer wiring structures 120 are covered by the associated solder resist layer 130 or 140 (Step S103). For example, the wiring layer 122 that is the uppermost layer of the multi-layer wiring structure 120 that is laminated on the upper surface of the core substrate 110 is covered by the solder resist layer 130, and the wiring layer 122 that is the lowermost layer of the multi-layer wiring structure 120 that is laminated on the lower surface of the core substrate 110 is covered by the solder resist layer 140.

Figure 5:
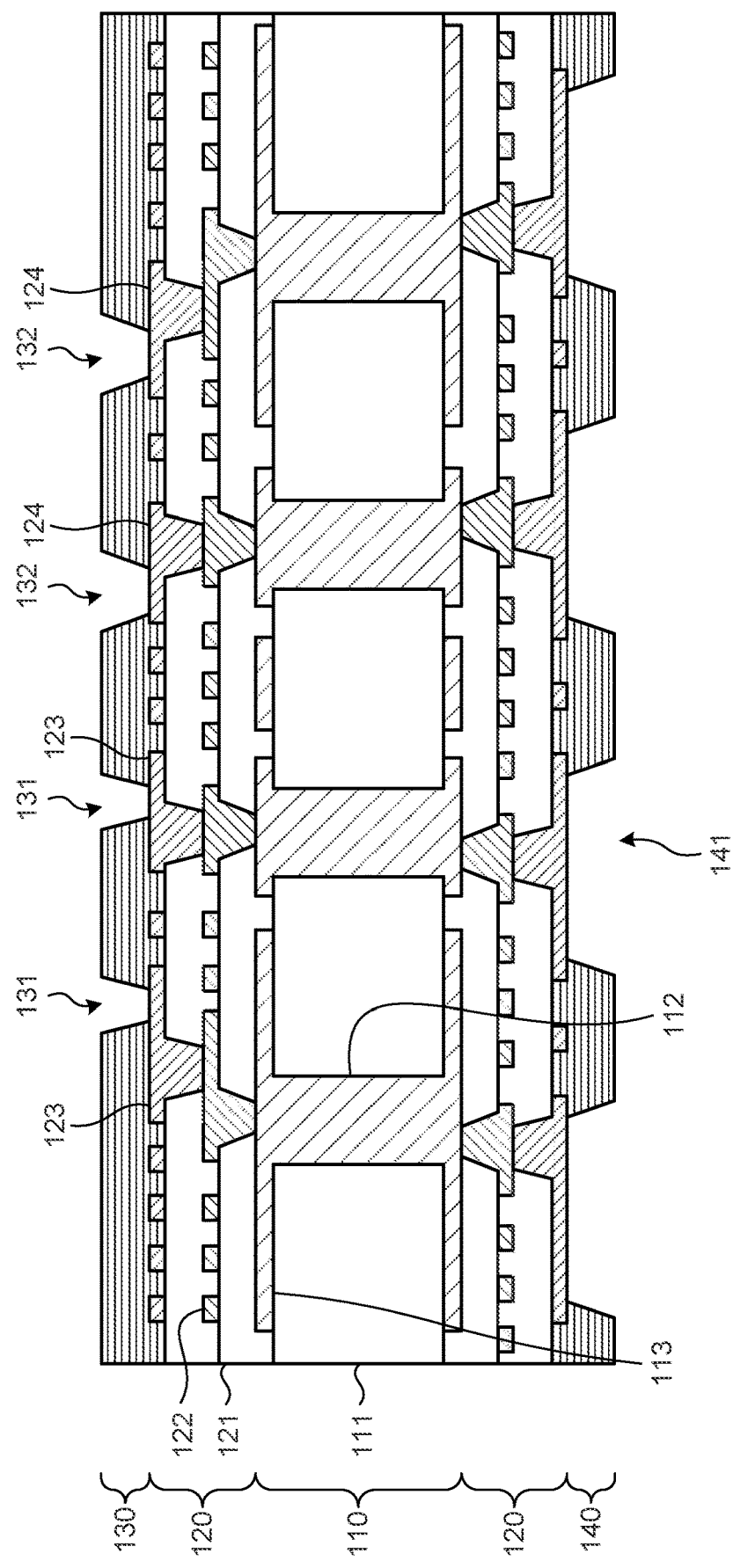
FIG. 5 is a diagram illustrating a specific example of forming a solder resist layer.

In addition, for example, as illustrated in FIG. 5, the solder resist layer 130 that is disposed on the side on which the semiconductor chip is mounted, the opening portions 131 and 132 are drilled at the position in which the connection terminal for connecting to the semiconductor chip is provided. At this time, for example, the size of the connection terminal is different in accordance with the type of the electrode of the semiconductor chip, so that the diameter of the opening portion 131 is different from the diameter of the opening portion 132. In other words, for example, the opening portion 131 in which the connection terminal that is used to input and output an electric signal is formed has a relatively smaller diameter, whereas, for example, the opening portion 132 in which the connection terminal that is used to apply a power supply voltage is formed has a relatively larger diameter. The pads 123 and 124 that are included in the wiring layer 122 having the multi-layer wiring structure 120 is exposed from the bottom of the opening portions 131 and 132, respectively.

In contrast, on the solder resist layer 140 that is disposed on the side that is connected to an external part or an external device, the opening portion 141 is drilled at the position in which the external connection terminal is provided. The wiring layer 122 that is disposed in the lowermost layer of the multi-layer wiring structure 120 is exposed from the bottom of the opening portion 141. In the case where a photosensitive resin is used for the solder resist layers 130 and 140, it is possible to form the opening portions 131, 132, and 141 by performing a process of exposure and development. Furthermore, in the case where a non-photosensitive resin is used for the solder resist layers 130 and 140, it is possible to form the opening portions 131, 132, and 141 by performing a process of laser beam machining.

Figure 6:
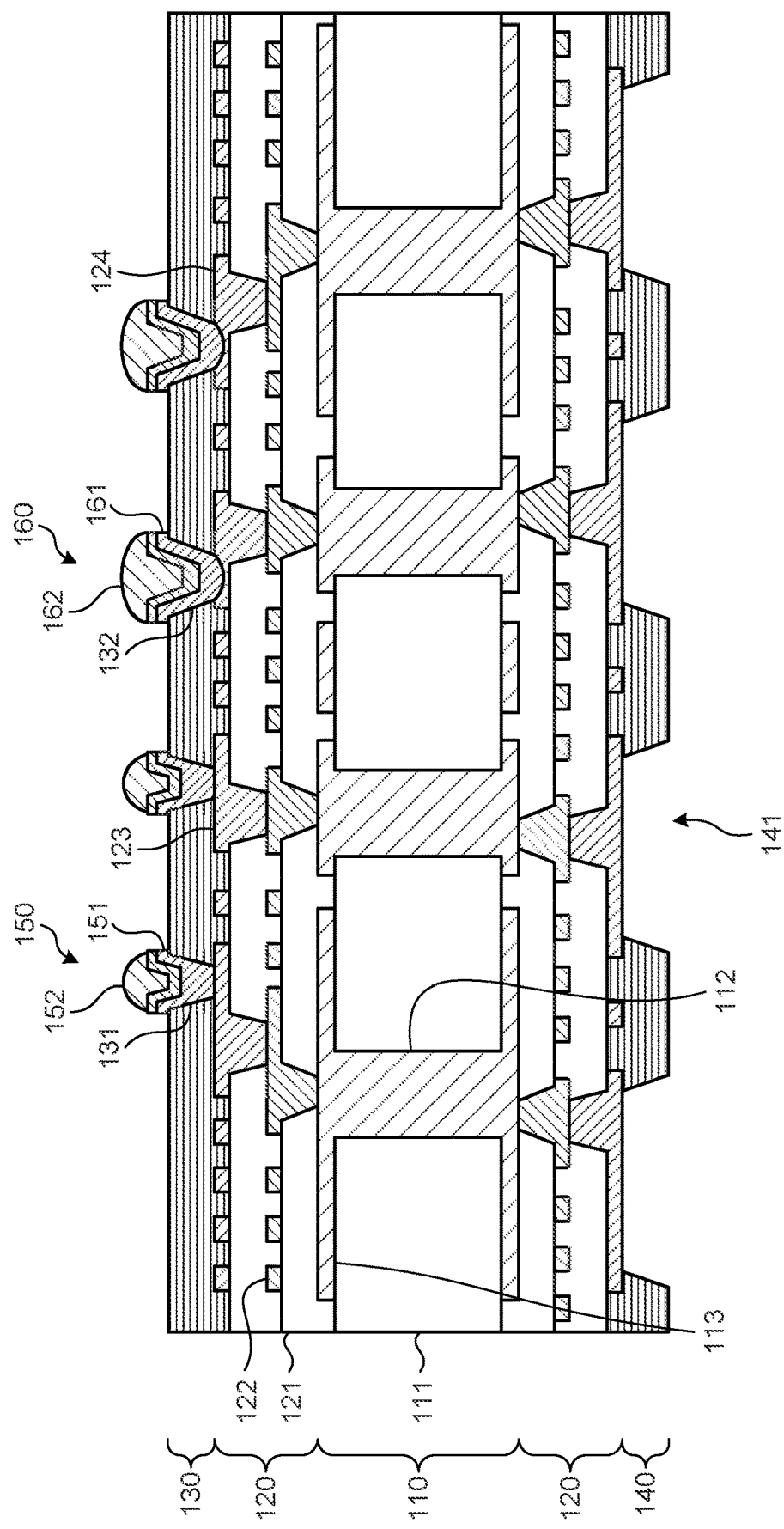
FIG. 6 is a diagram illustrating a specific example of forming a terminal.

Then, the connection terminal that is used to connect the semiconductor chip is formed at each of the opening portions 131 and 132 that are formed in the solder resist layer 130 (Step S104). In other words, for example, as illustrated in FIG. 6, the bump 150 having a smaller diameter is formed in the opening portion 131, whereas the bump 160 having a larger diameter is formed in the opening portion 132. Both of the bumps 150 and 160 have the two-layered structure, and the second metal layers 152 and 162 that overlap with the first metal layers 151 and 161, respectively, protrude upward in a spherical shape. Both of the first metal layers 151 and 161 and the second metal layers 152 and 162 are formed by performing a process of plating.

The first metal layer 151 is formed by performing a process of, for example, copper plating on the opening portion 131 and the circumference of the opening portion 131, fills the interior of the opening portion 131, and extends around the circumference of the opening portion 131 on the upper surface of the solder resist layer 130. A recess portion is formed at the position overlapping with the opening portion 131 formed in the first metal layer 151 in a plan view, and the upper surface around the circumference of the recess portion is formed at a position higher than a position of the upper surface of the solder resist layer 130. In addition, the second metal layer 152 is formed by performing tin plating on the upper surface of the first metal layer 151 via, for example, a nickel layer. The second metal layer 152 protrudes upward in a spherical shape as a result of being melted and solidified by way of a reflow process.

In contrast, the first metal layer 161 is formed by performing, for example, copper plating on the opening portion 132 and the circumference of the opening portion 132, fills the interior of the opening portion 132, and extends around the circumference of the opening portion 132 on the upper surface of the solder resist layer 130. A recess portion is formed at the position overlapping with the opening portion 132 formed on the first metal layer 161 in a plan view, and the upper surface around the circumference of the recess portion is formed at a position that is higher than a position of the upper surface of the solder resist layer 130. The recess portion formed on the first metal layer 161 is deeper than the recess portion formed on the first metal layer 151, and has a larger cubic capacity. In addition, the second metal layer 162 is formed by performing tin plating on the upper surface of the first metal layer 161 via, for example, a nickel layer. The second metal layer 162 protrudes upward in a spherical shape as a result of being melted and solidified by way of a reflow process.

Some of the second metal layers 152 and 162 are stored in the recess portions of the first metal layers 151 and 161, respectively, so that the height of the apex portion of each of the second metal layers 152 and 162 is lower as compared to the case where the recess portion is not formed on each of the first metal layers 151 and 161. At this time, the cubic capacity of the recess portion in the first metal layer 161 is larger than the cubic capacity of the recess portion of the first metal layer 151, so that an amount of the second metal layer 162 stored in the recess portion is larger as compared to a case of the second metal layer 152. As a result, even if the cubic volume of the second metal layer 162 formed at the bump 160 having a larger diameter is larger than the cubic volume of the second metal layer 152 formed at the bump 150 having a smaller diameter, the height from the upper surface of the solder resist layer 130 to each of the apex portions of the bumps 150 and 160 is the same. Furthermore, a forming step of the bumps 150 and 160 will be described in detail later.

Figure 7:
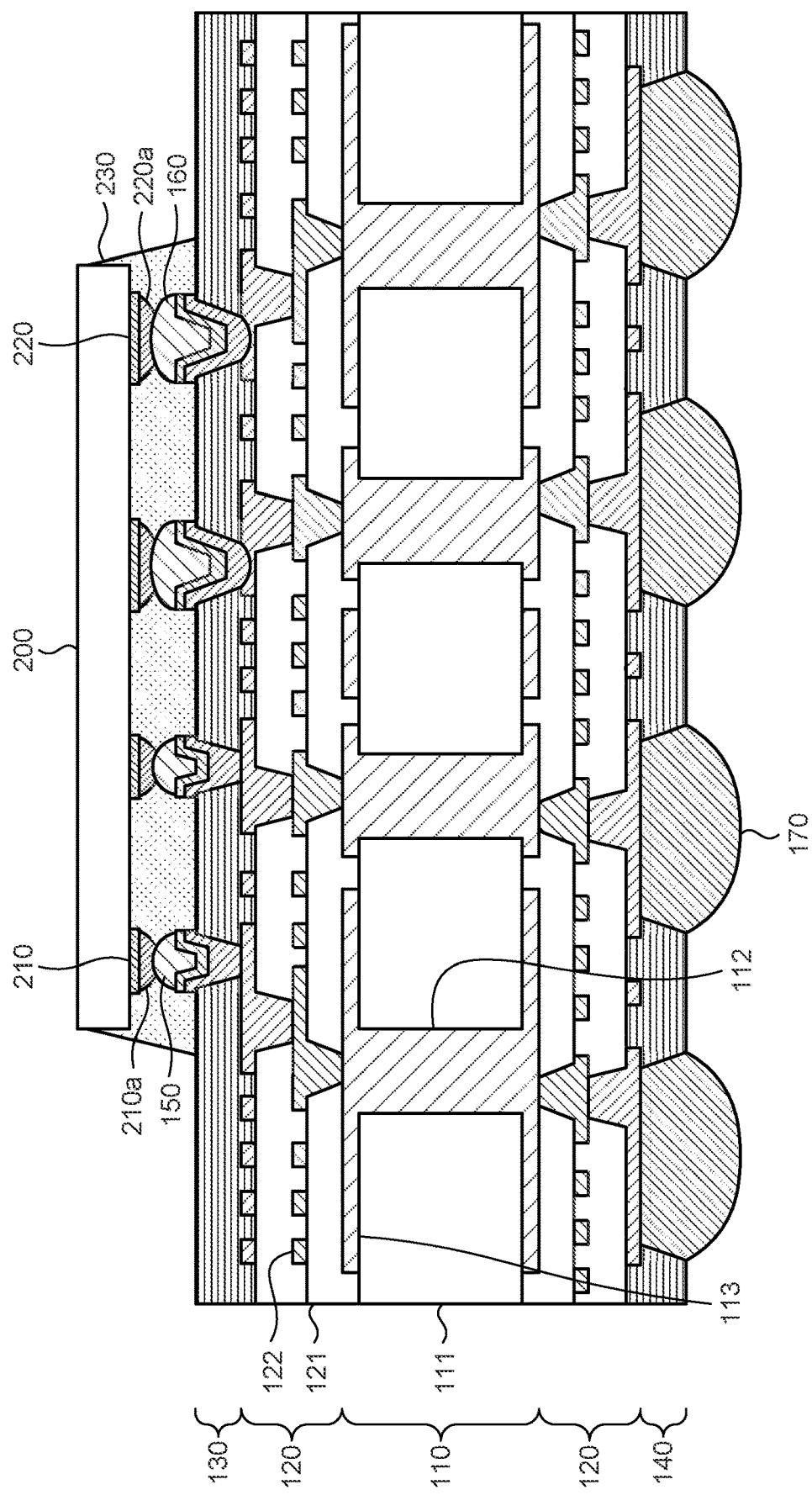
FIG. 7 is a diagram illustrating a specific example of mounting a semiconductor chip.

If the bumps 150 and 160 are formed on the solder resist layer 130 side, external connection terminals are formed on the solder resist layer 140 side (Step S105). Then, a semiconductor chip is mounted on the solder resist layer 130 side (Step S106), the bumps 150 and 160 are connected to the electrodes of the semiconductor chip. Specifically, for example, as illustrated in FIG. 7, the external connection terminals, such as solder balls 170, are formed at the respective opening portions 141 that are formed on the solder resist layer 140. Furthermore, a semiconductor chip 200 is mounted on an upper portion of the bumps 150 and 160, electrodes 210 of the semiconductor chip 200 are bonded to the bumps 150, and electrodes 220 are bonded to the bumps 160. At this time, bumps 210a and 220a and the bumps 150 and 160 provided at the electrodes 210 and 220, respectively, of the semiconductor chip 200 are melted and solidified by a reflow. As a result, at the bonding portion between the electrodes 210 and 220 and the bumps 150 and 160, respectively, the bumps 210a and 220a and the bumps 150 and 160, respectively, are mixed together and are melted and solidified.

Then, the bonding portion between the electrodes 210 and 220 and the bumps 150 and 160, respectively, are sealed by an underfill resin 230, and a semiconductor package in which the semiconductor chip 200 is mounted on the wiring substrate 100 is obtained. Furthermore, the step of forming the external connection terminal and the step of mounting the semiconductor chip described above may be performed in reverse order. In other words, after the semiconductor chip 200 is mounted on the wiring substrate 100, the external connection terminals, such as the solder balls 170, may be formed at the opening portion 141 that is formed on the solder resist layer 140.

Figure 8:
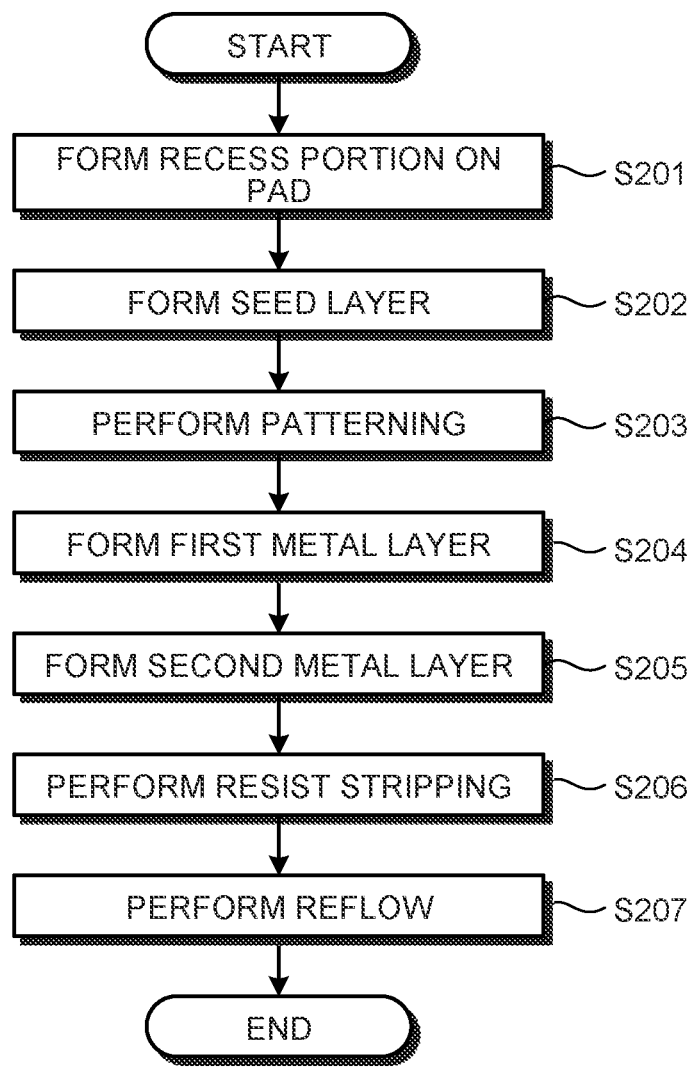
FIG. 8 is a flowchart illustrating a step of forming the terminal.

In the following, a forming step of the bumps 150 and 160 functioning as connection terminals connected to the semiconductor chip 200 will be more specifically described with reference to the flowchart illustrated in FIG. 8.

Figure 9:
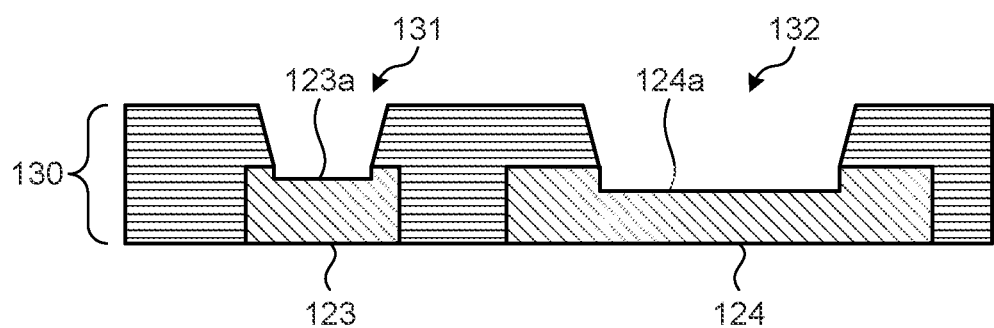
FIG. 9 is a diagram illustrating an opening portion of the solder resist layer.

If the multi-layer wiring structure 120 is laminated on the upper surface of the core substrate 110, the wiring layer 122 that is the uppermost layer of the multi-layer wiring structure 120 is covered by the solder resist layer 130. At this time, the pads 123 and 124 included in the wiring layer 122 that is the uppermost layer is also covered by the solder resist layer 130. For example, as illustrated in FIG. 9, the opening portions 131 and 132 are drilled into the solder resist layer 130. The opening diameter of the opening portion 131 is, for example, about 20 to 30 μm, and the depth is about 13 to 23 μm. Furthermore, the opening diameter of the opening portion 132 is, for example, about 30 to 40 μm, and the depth is, similarly to the opening portion 131, about 13 to 23 μm. Then, each of recess portions 123a and 124a are formed on the pads 123 and 124 that are exposed on the bottom surface of the opening portions 131 and 132, respectively (Step S201).

Specifically, the recess portions 123a and 124a are formed on the surface of the pads 123 and 124 by performing excessive etching at the step of post-processing of removing the residue of the insulating resin that is performed after the opening portions 131 and 132 are formed by a process of exposure and development or laser beam machining. In other words, by increasing a period of time for which the pads 123 and 124 that are exposed on the bottom surface of the respective opening portions 131 and 132 is immersed in an etching solution, the residues of the insulating resin remaining on the surfaces of the pads 123 and 124 are removed, and the recess portions 123a and 124a are formed, respectively. At this time, the opening portion 132 has a larger diameter than the opening portion 131, so that an exposure area of the pad 124 that is exposed on the bottom surface of the opening portion 132 is greater than an exposure area of the pad 123 that is exposed on the bottom surface of the opening portion 131, and the pad 124 is more greatly eroded. As a result, the recess portion 124a formed on the pad 124 is deeper than the recess portion 123a formed on the pad 123. The recess portion 123a corresponds to a first recess portion and the recess portion 124a corresponds to a second recess portion.

Furthermore, in the case where the opening portions 131 and 132 are formed by performing a process of laser beam machining, it is possible to form the recess portions 123a and 124a in the pads 123 and 124, respectively, by excessively irradiating a laser. In other words, as a result of irradiating the solder resist layer 130 with a laser, it is possible to form the recess portions 123a and 124a on the surface of the pads 123 and 124 by continuously irradiating the pads 123 and 124 that are exposed on the bottom surface of the respective opening portions 131 and 132 with a laser even after the respective opening portions 131 and 132 are formed. At this time, by performing laser irradiation on the pad 124 in a longer time compared to a case of the pad 123, it is possible to obtain the recess portion 124a that is deeper than the recess portion 123a.

Figure 10:
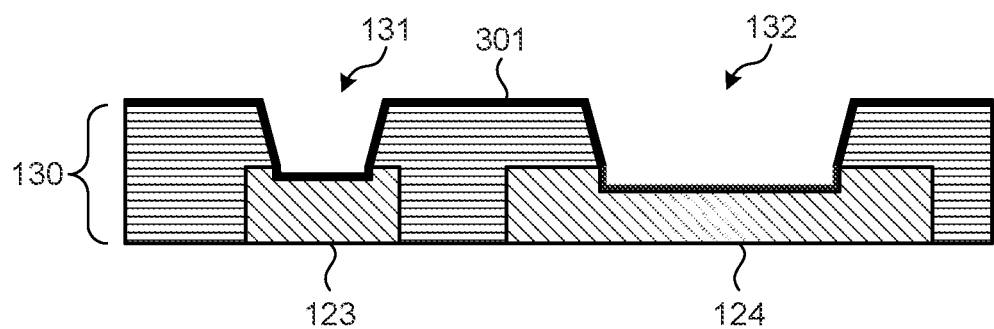
FIG. 10 is a diagram illustrating a process of forming a seed layer.

If the opening portions 131 and 132 are formed in the solder resist layer 130, and, if the recess portions 123a and 124a are formed in the pads 123 and 124, respectively, a seed layer is formed on the surface of the solder resist layer 130 (Step S202). In other words, for example, as illustrated in FIG. 10, a seed layer 301 is formed on the entire surface of the solder resist layer 130, and the pads 123 and 124 that are exposed to the opening portions 131 and 132, respectively, by performing a process of, for example, electroless copper plating, sputtering on copper, or the like. The seed layer 301 has a thickness of, for example, about 0.40 to 0.60 μm, and is able to be formed by performing a process of electroless copper plating for, for example, 15 minutes at bath temperature of 34±2° C.

Figure 11:
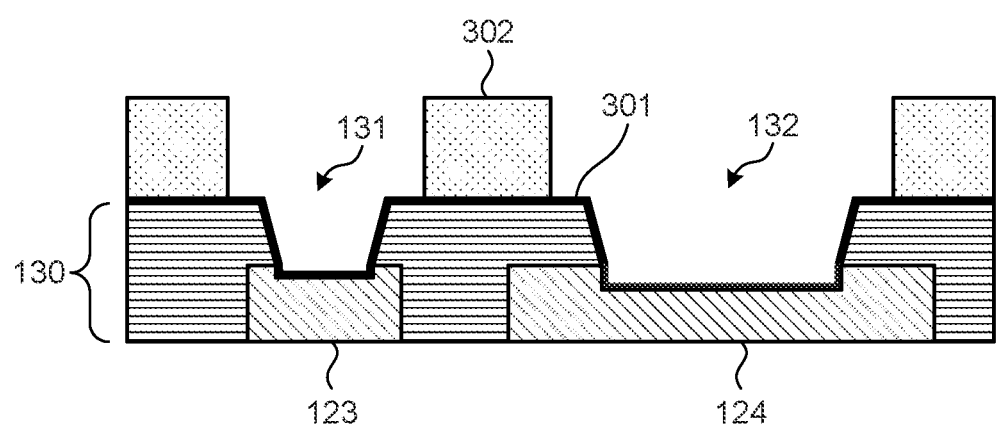
FIG. 11 is a diagram illustrating patterning.

Then, patterning for forming a circuit pattern on the surface of the wiring substrate 100 is performed (Step S203). Specifically, for example, as illustrated in FIG. 11, after a dry film resist 302 is pasted on the surface of the wiring substrate 100, exposure and development of the circuit pattern is performed, and the dry film resist is removed from the wiring portion including the opening portions 131 and 132. The opening diameter of the dry film resist 302 around the circumference of the opening portion 131 is, for example, about 27 to 47 μm, and the opening diameter of the dry film resist 302 around the circumference of the opening portion 132 is, for example, about 60 to 80 μm. In addition, the thickness of the dry film resist 302 is, for example, about 30 to 40 μm.

Then, by performing a process of, for example, copper plating, the first metal layers 151 and 161 are formed at the opening portions 131 and 132, respectively (Step S204). At this time, it is possible to form the first metal layers 151 and 161 by performing copper plating using a copper sulfate plating solution containing, for example, a polymer (inhibitor), a brightener (accelerating agent), and a leveler. The polymer (inhibitor) used may be, for example, a non-ionic surfactant, such as polyethylene glycol (polyether compound), whereas the brightener (accelerating agent) used may be, for example, an organosulfur compound, such as Bis(3-sulfopropyl) disulfide. Furthermore, the leveler used may be, for example, a quaternary amine compound.

Figure 12:
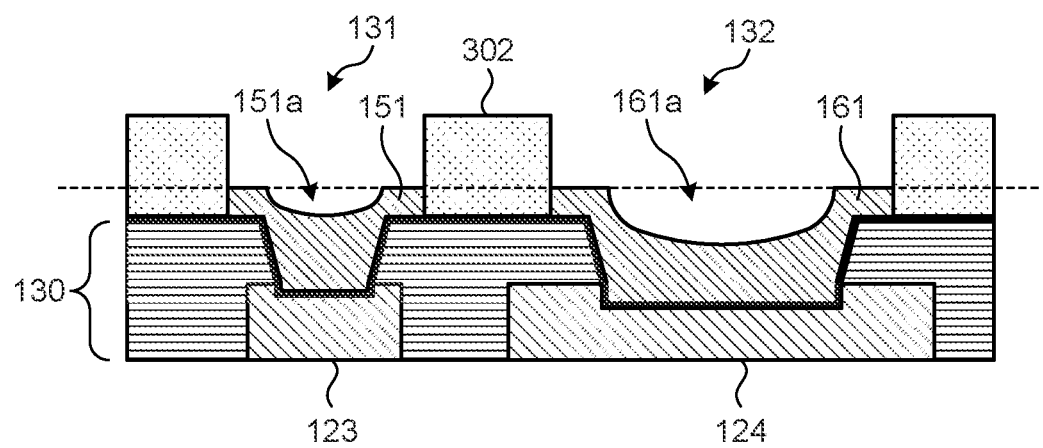
FIG. 12 is a diagram illustrating a process of forming a first metal layer.

By performing copper plating using the copper sulfate plating solution as described above at a predetermined electric current density in a predetermined period of time, copper is deposited into the area in which the dry film resist 302 has been removed, and the first metal layers 151 and 161 are formed in the area including the interior of the opening portions 131 and 132, respectively. Here, by setting the period of time for which copper plating is continued to be shorter than usual, for example, as illustrated in FIG. 12, the thickness of the copper deposited around the circumference of each of the opening portion 131 having a smaller diameter is equal to that of the opening portion 132 having a larger diameter, and the thicknesses of the first metal layers 151 and 161 at the portion extending on the upper surface of the solder resist layer 130 become uniform. At the same time, recess portions 151a and 161a are formed at the position at which the respective opening portions 131 and 132 overlaps with each other formed on the respective first metal layers 151 and 161 in a plan view. The recess portion 151a corresponds to a third recess portion and the recess portion 161a corresponds to a fourth recess portion.

Some of the lower portion of the first metal layers 151 and 161 are stored in the recess portions 123a and 124a formed on the pads 123 and 124, respectively; however, as described above, the recess portion 124a is deeper than the recess portion 123a and has a larger cubic capacity. Accordingly, the cubic volume of the first metal layer 161 stored in the recess portion 124a is larger than the cubic volume of the first metal layer 151 stored in the recess portion 123a, and, even if the first metal layers 151 and 161 are formed by performing copper plating in a same period of time, the recess portion 161a is deeper than the recess portion 151a and has a larger cubic capacity. Furthermore, by forming the first metal layers 151 and 161 in the recess portions 123a and 124a that are formed on the pads 123 and 124, it is possible to improve adhesiveness of the first metal layers 151 and 161 by the anchor effect. As a result, it is possible to prevent the bumps 150 and 160 that is finally formed from falling off from the wiring substrate 100.

Figure 13:
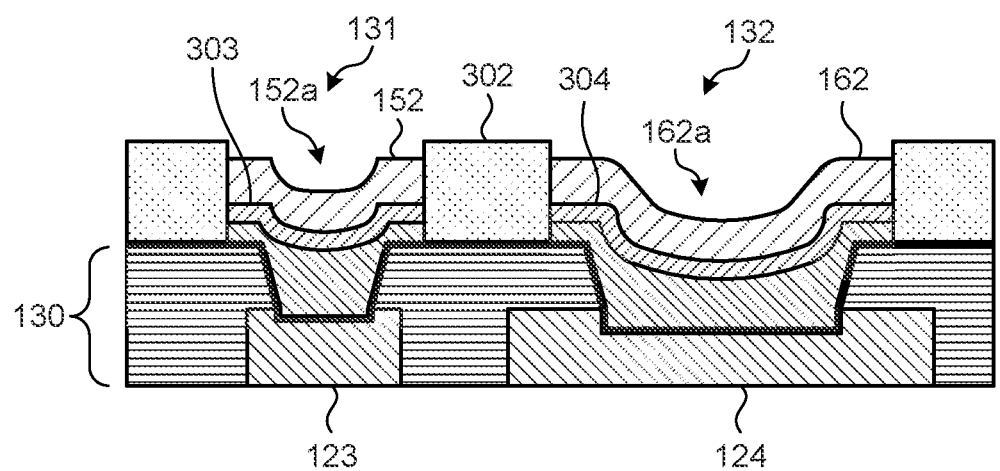
FIG. 13 is a diagram illustrating a process of forming a second metal layer.

After the first metal layers 151 and 161 are formed by performing copper plating, the second metal layers 152 and 162 are formed at the opening portions 131 and 132, respectively, by performing, for example, tin plating (Step S205). At this time, for example, as illustrated in FIG. 13, nickel layers 303 and 304 may be present between the first metal layers 151 and 161 and the second metal layers 152 and 162, respectively. The nickel layers 303 and 304 are formed to have a uniform thickness along the surface of the first metal layers 151 and 161, respectively. By using the nickel layers 303 and 304 as interventions, it is possible to prevent copper contained in the first metal layers 151 and 161 from dissolving out with tin contained in the respective second metal layers 152 and 162. Each of the nickel layers 303 and 304 has a thickness of, for example, about 1 to 5 μm, and is able to be formed by performing nickel plating by applying an electrolytic nickel plating condition in which, for example, an electric current density is 1.0 ASD and plating time is 17.2 minutes. Furthermore, in order to prevent dissolution and diffusion of copper contained in the first metal layers 151 and 161, it may be possible to allow, as interventions, a layer constituted of a metal that is other than nickel and that has a melting point higher than that of the metal that is used for each of the second metal layers 152 and 162 to be present between the first metal layers 151 and 161 and the second metal layers 152 and 162, respectively.

In the process of forming the second metal layers 152 and 162, plating is performed such that the thicknesses of the opening portions 131 and 132 become uniform. As a result, similarly to the upper surfaces of the first metal layers 151 and 161, recess portions 152a and 162a are formed on the upper surfaces of the second metal layers 152 and 162. Each of the second metal layers 152 and 162 has a thickness of, for example, about 10 to 20 μm, and is able to be formed by performing tin plating by applying an electrolytic tin plating condition in which, for example, an electric current density is 1.5 ASD and plating time is 23.3 minutes. The second metal layers 152 and 162 may be formed by using, for example, in addition to tin, various solder metals, such as a tin-silver based alloy, a tin-silver-copper based alloy, or a tin-bismuth based alloy.

When the second metal layers 152 and 162 are formed, the dry film resist 302 is stripped (Step S206). For a strip process, for example, sodium hydroxide or an amine-based alkaline stripping solution is used. In addition, flash etching is performed, and the seed layer 301 that is a portion that has not been subjected to plating is removed. At the time of flash etching, an etching solution is also permeated on the side surfaces of the first metal layers 151 and 161 that are exposed on the upper surface of the solder resist layer 130, and side etching occurs. In the present embodiment, the exposed side surfaces of the first metal layers 151 and 161 have the same height, and thus, an amount of side etching performed on each of the first metal layers 151 and 161 becomes uniform. As a result, it is possible to allow the possibility that the first metal layers 151 and 161 fall off from the solder resist layer 130 to be the same, and it is possible to prevent both of the first metal layers 151 and 161 from falling off by appropriately control an amount of side etching.

Figure 14:
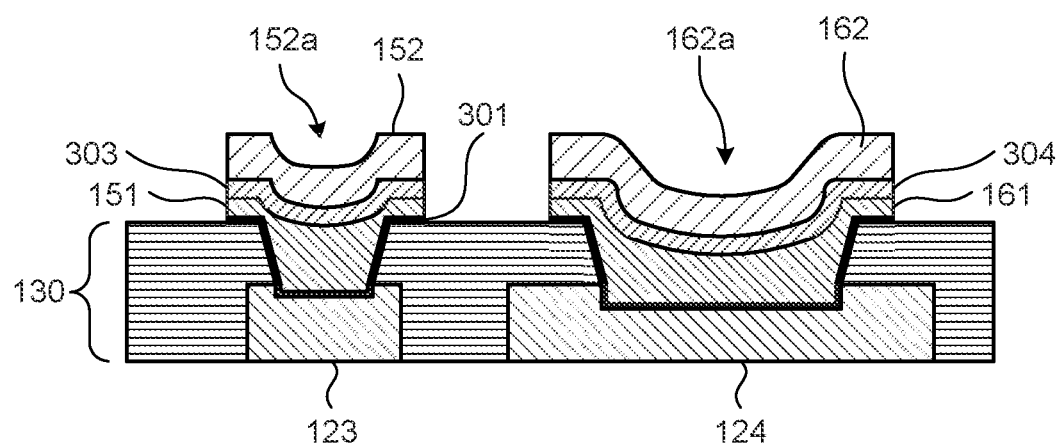
FIG. 14 is a diagram illustrating photoresist stripping.

By performing flash etching for removing the seed layer 301, for example, as illustrated in FIG. 14, in the opening portion 131, the seed layer 301, the first metal layer 151, the nickel layer 303, and the second metal layer 152 are laminated, and a conductor portion protruding from the upper surface of the solder resist layer 130 is formed. In addition, in the opening portion 132, the seed layer 301, the first metal layer 161, the nickel layer 304, and the second metal layer 162 are laminated, and a conductor portion protruding from the upper surface of the solder resist layer 130 is formed. The recess portions 152a and 162a remain at the center of the respective second metal layers 152 and 162.

In this state, a reflow for melting the second metal layers 152 and 162 is performed at a reflow temperature (Step S207). In other words, after allowing the second metal layers 152 and 162 to be melted at a high temperature, the second metal layers 152 and 162 are solidified by cooling the second metal layers 152 and 162, respectively. At this time, the melting point of the metal (for example, copper) that forms the first metal layers 151 and 161 is higher than the melting point of the metal (for example, tin) that forms the second metal layers 152 and 162, respectively, so that the first metal layers 151 and 161 are not melted and only the second metal layers 152 and 162 are melted and solidified.

Figure 15:
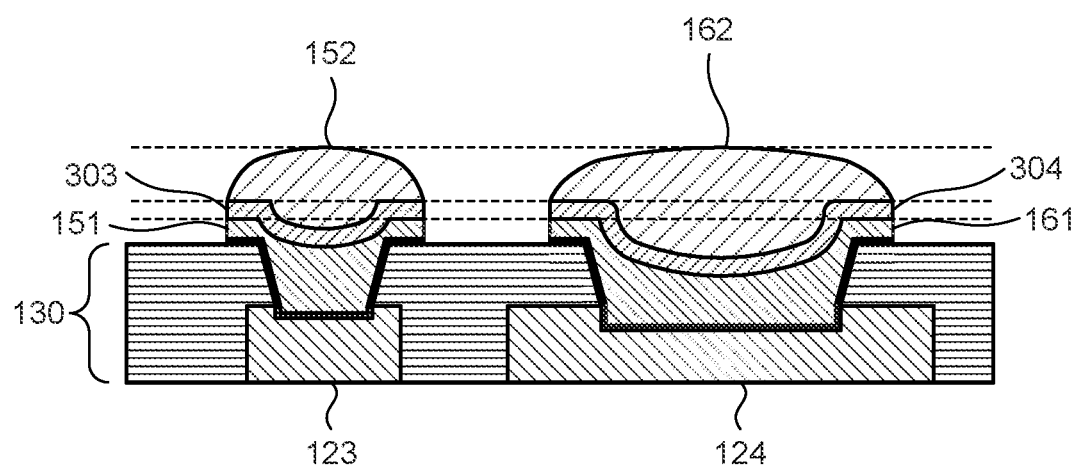
FIG. 15 is a diagram illustrating reflow.

As a result, for example, as illustrated in FIG. 15, the upper surfaces of the second metal layers 152 and 162 protrude upward in a spherical shape, and the bumps 150 and 160 are formed, respectively. Here, a part of the second metal layer 152 is stored in the recess portion 151a that is formed on the first metal layer 151, and a part of the second metal layer 162 is stored in the recess portion 161a that is formed on the first metal layer 161. In addition, the cubic capacity of the recess portion 161a is larger than the cubic capacity of the recess portion 151a, so that the cubic volume stored in the recess portion is larger in the second metal layer 162, and thus, the apex portions of the second metal layers 152 and 162 become the same height. In other words, even if the second metal layers 152 and 162 are formed by using a single plating process at the same time, the height from the upper surface of the solder resist layer 130 to each of the apex portions of the bumps 150 and 160 is the same. As a result, when the semiconductor chip 200 is mounted, it is possible to avoid a poor open by allowing the bumps 150 and 160 to be reliably brought into contact with the respective electrodes 210 and 220 of the semiconductor chip 200. Furthermore, it is possible to prevent only one of the apex portions of the bumps 150 and 160 from being excessively pressed by the semiconductor chip 200 and extended in the horizontal direction, and it is thus possible to avoid a short circuit fault in which the adjacent bumps are brought into contact with each other.

As described above, according to the present embodiment, when a bump is formed, by performing plating, at the opening portion of the solder resist layer in the wiring substrate, the structure is constituted to form a recess portion in accordance with the diameter of the opening portion in the pad that is exposed on the bottom surface of the opening portion, and to form a deeper recess portion in the first metal layer as the diameter of the opening portion is larger. As a result, in the case where the second metal layer that overlaps with the first metal layer is melted and solidified, a part of the second metal layer is able to be more reliably stored in the recess portion formed on the first metal layer as the diameter of the opening portion is larger. As a result, even if the plurality of opening portions have different diameters, it is possible to allow the height from the surface of the solder resist layer to each of the apex portions of the bumps formed at the associated opening portions to be equal, and it is possible to ensure the connection reliability of the electronic components that are connected to the bumps mounted on the wiring substrate. Furthermore, there is no need to perform a step, such as an additional plating step, for allowing the height of the bumps to be equal, so that it is possible to suppress a decrease in the manufacturing efficiency.

According to an aspect of an embodiment of the wiring substrate and the method of manufacturing the wiring substrate described in the present invention, an advantage is provided in that it is possible to suppress a decrease in manufacturing efficiency while ensuring the connection reliability of the electronic components.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

Note (1). A method of manufacturing a wiring substrate comprising:
- a step of forming a wiring layer that includes a first pad and a second pad;
- a step of forming an insulating layer that covers the wiring layer and that includes a first opening portion that penetrates to the first pad and a second opening portion that penetrates to the second pad and that has a larger diameter than the first opening portion;
- a step of forming a first recess portion on a surface of the first pad that is exposed on a bottom surface of the first opening portion and forming a second recess portion, on a surface of the second pad that is exposed on a bottom surface of the second opening portion, that is deeper than the first recess portion of the first pad;
- a step of forming, by metal plating, a first metal layer filling an interior of each of the first opening portion and the second opening portion, extending on an upper surface of the insulating layer, and including a third recess portion at a position overlapping with the first opening portion and a fourth recess portion at a position overlapping with the second opening portion in a plan view;
- a step of forming, by another metal plating, a second metal layer to be superposed on the first metal layer; and
- a step of solidifying the second metal layer after the second metal layer is melted, wherein
the step of forming the first metal layer includes a step of making a thickness of a portion extending on the upper surface of the insulating layer uniform.

What is claimed is:

1. A wiring substrate comprising:
   a wiring layer that includes a first pad on a surface of which a first recess portion is formed and a second pad on a surface of which a second recess portion is formed, the second recess portion being deeper than the first recess portion and the second recess portion having a larger diameter than the first recess portion;
   an insulating layer that covers the wiring layer and that includes a first opening portion that penetrates to the first recess portion of the first pad and a second opening portion that penetrates to the second recess portion of the second pad and that has a larger diameter than the first opening portion;
   a first metal layer that fills an interior of each of the first opening portion and the second opening portion, that extends on an upper surface of the insulating layer, and that includes a third recess portion at a position overlapping with the first opening portion and the first recess portion, the third recess portion corresponding to the first recess portion, and a fourth recess portion at a position overlapping with the second opening portion and the second recess portion, the fourth recess portion corresponding to the second recess portion, in a plan view; and
   a second metal layer that is formed to be superposed on the first metal layer and a part of which is stored in the third recess portion and the fourth recess portion of an upper surface of the first metal layer, wherein
   the first metal layer is formed so that a thickness of the first metal layer at a portion extending on the upper surface of the insulating layer becomes uniform, and
   the fourth recess portion is deeper than the third recess portion and has a larger diameter than the third recess portion.

2. The wiring substrate according to claim 1, wherein the second metal layer has a surface located further away from the first metal layer, the surface of the second metal layer protruding upward in a spherical shape.

3. The wiring substrate according to claim 1, wherein the first metal layer is formed of a metal having a higher melting point than a metal that forms the second metal layer.

4. The wiring substrate according to claim 1, wherein
   the first metal layer contains copper, and
   the second metal layer contains tin.

5. The wiring substrate according to claim 1, further comprising a nickel layer that is interposed between the first metal layer and the second metal layer.

6. The wiring substrate according to claim 1, wherein a deepest portion of the fourth recess portion is positioned to be lower than the upper surface of the insulating layer.

7. A wiring substrate comprising:
   a wiring layer that includes a first pad on a surface of which a first recess portion is formed and a second pad on a surface of which a second recess portion that is deeper than the first recess portion of the first pad is formed;
   an insulating layer that covers the wiring layer and that includes a first opening portion that penetrates to the first recess portion of the first pad and a second opening portion that penetrates to the second recess portion of the second pad and that has a larger diameter than the first opening portion;
   a first metal layer that fills an interior of each of the first opening portion and the second opening portion, that extends on an upper surface of the insulating layer, and that includes a third recess portion at a position overlapping with the first opening portion and a fourth recess portion at a position overlapping with the second opening portion in a plan view; and
   a second metal layer that is formed to be superposed on the first metal layer and a part of which is stored in the third recess portion and the fourth recess portion of an upper surface of the first metal layer, wherein
   the first metal layer is formed so that a thickness of the first metal layer at a portion extending on the upper surface of the insulating layer becomes uniform,
   the fourth recess portion is deeper than the third recess portion, and
   a deepest portion of the fourth recess portion is positioned to be lower than the upper surface of the insulating layer.

8. The wiring substrate according to claim 7, wherein the second metal layer has a surface located further away from the first metal layer, the surface of the second metal layer protruding upward in a spherical shape.

9. The wiring substrate according to claim 7, wherein the first metal layer is formed of a metal having a higher melting point than a metal that forms the second metal layer.

10. The wiring substrate according to claim 7, wherein
   the first metal layer contains copper, and
   the second metal layer contains tin.

11. The wiring substrate according to claim 7, further comprising a nickel layer that is interposed between the first metal layer and the second metal layer.

* * * * *